(12) United States Patent
Schindler

(10) Patent No.: US 8,599,366 B2
(45) Date of Patent: Dec. 3, 2013

(54) METHOD AND DEVICE FOR DETERMINING A DEFORMATION OF A DISK-SHAPED WORKPIECE, PARTICULARLY A MOLD WAFER

(75) Inventor: Rudger Schindler, Neustadt-Birkig (DE)

(73) Assignee: ERS Electronic GmbH, Germering (DE)

( * ) Notice: Subject to any disclaimer, the term of this patent is extended or adjusted under 35 U.S.C. 154(b) by 0 days.

(21) Appl. No.: 13/399,403

(22) Filed: Feb. 17, 2012

(65) Prior Publication Data
US 2012/0236289 A1 Sep. 20, 2012

Related U.S. Application Data

(63) Continuation of application No. PCT/EP2010/062056, filed on Aug. 18, 2010.

(30) Foreign Application Priority Data

Aug. 19, 2009 (DE) .......................... 10 2009 037 939

(51) Int. Cl.
*G01C 3/08* (2006.01)
(52) U.S. Cl.
USPC ......... 356/4.08; 356/3.01; 356/3.1; 356/4.01; 356/4.1
(58) Field of Classification Search
USPC ............. 356/3.01–3.15, 4.01–4.1, 5.01–5.15, 356/6–22, 28, 28.5, 139.01–139.1
See application file for complete search history.

(56) References Cited

U.S. PATENT DOCUMENTS

| 4,457,664 | A | 7/1984 | Judell |
| 4,750,141 | A | 6/1988 | Judell |
| 4,931,962 | A | 6/1990 | Palleiko |
| 6,275,742 | B1 | 8/2001 | Sagues et al. |

(Continued)

FOREIGN PATENT DOCUMENTS

| EP | 1821065 | 8/2007 |
| JP | 01-267403 | 10/1989 |

(Continued)

OTHER PUBLICATIONS

International Search Report and Preliminary Report on Patentability (with English translation) for PCT Application No. PCT/EP2010/062056 dated Nov. 3, 2010.

*Primary Examiner* — Luke Ratcliffe
(74) *Attorney, Agent, or Firm* — Jenkins, Wilson, Taylor & Hunt, P.A.

(57) ABSTRACT

The present invention relates to a method and a device for determining a deformation of a disc-shaped workpiece, in particular a mold wafer. The device comprises a rotatable, height and laterally adjustable mounting unit for mounting an inner region of the disc-shaped workpiece; a determination unit for determining eccentricity of a center axis of the disc-shaped workpiece from a center axis of the mounting unit and for generating a suitable adjustment signal for the mounting unit; a deposit unit for depositing the disc-shaped workpiece during a process of lateral adjustment of the mounting unit; and a fixed-height detector unit for measuring a deviation of a plurality of measuring points, respectively, in a non-mounted outer region of the disc-shaped workpiece from a predetermined height position corresponding to the deformation by rotating the mounting unit or the detector unit at a predetermined height position of the mounting unit.

17 Claims, 8 Drawing Sheets

(56) References Cited

U.S. PATENT DOCUMENTS

| | | |
|---|---|---|
| 7,668,056 B2 | 2/2010 | Yamada et al. |
| 2002/0071129 A1* | 6/2002 | Chen et al. .................... 356/635 |
| 2005/0255610 A1 | 11/2005 | Sato |
| 2006/0180581 A1* | 8/2006 | Swaringen et al. ...... 219/121.83 |
| 2006/0280085 A1 | 12/2006 | Yamada et al. |

FOREIGN PATENT DOCUMENTS

| | | |
|---|---|---|
| JP | 06-163661 | 6/1994 |
| JP | 10-078310 | 3/1998 |
| KR | 2008/0065392 | 7/2008 |
| WO | WO 99/52686 | 10/1999 |

\* cited by examiner

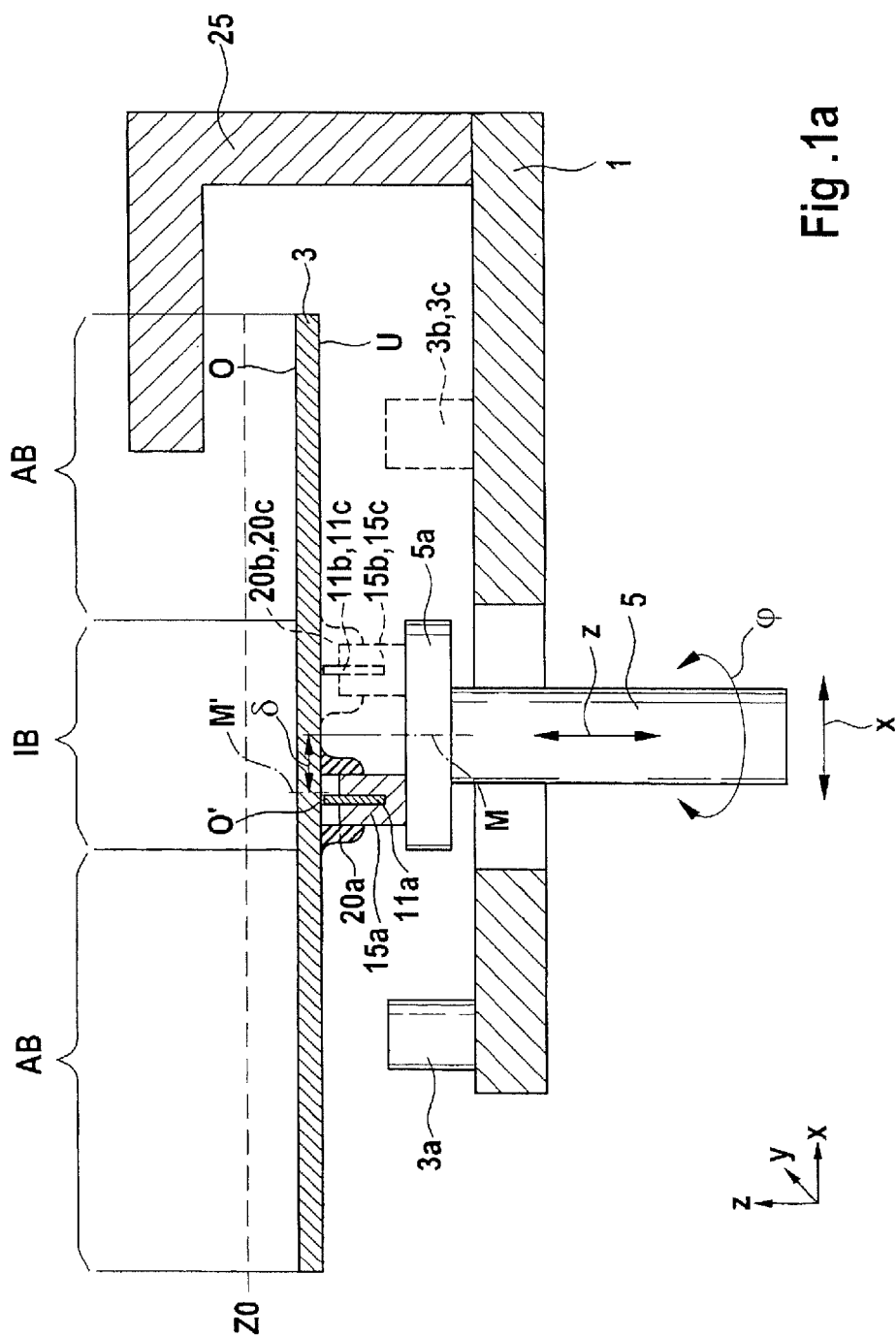

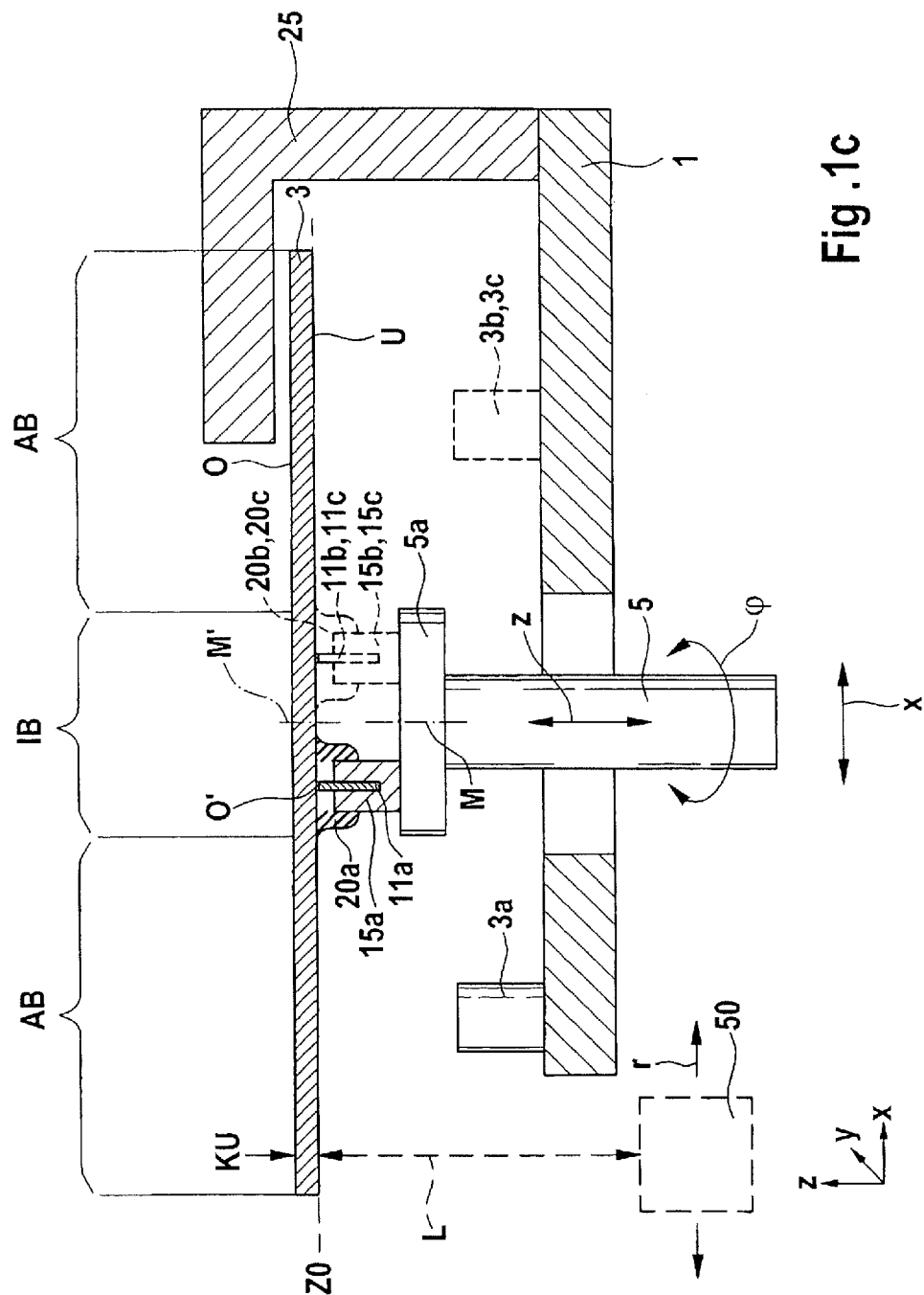

METHOD AND DEVICE FOR DETERMINING A DEFORMATION OF A DISK-SHAPED WORKPIECE, PARTICULARLY A MOLD WAFER

CROSS-REFERENCE TO RELATED APPLICATIONS

This application is a continuation of and claims priority to PCT/EP2010/062056 filed on Aug. 18, 2010, which claims the benefit of and priority to German Patent Application No. 10 2009 037 939.8 filed on Aug. 19, 2009, the disclosures of which are incorporated herein by reference in their entirety.

TECHNICAL FIELD

The present invention relates to a method and a device for determining a deformation of a disc-shaped workpiece, in particular a mould wafer.

BACKGROUND

Although they are not limited to the field of semiconductor technology, the present invention and the problems on which it is based are explained in relation to mould wafers.

In the field of semiconductor technology, disc-shaped workpieces, referred to in this case as wafers, are generally processed in a linear processing chain, i.e. in the context of flow line production in a plurality of successive devices which carry out coordinated method steps.

In the wafer processing in this case, exact alignment of the wafer is necessary before further processing, in particular before sawing out the individual chips from the wafer or before electrically contacting the chip. For this purpose, what are known as workpiece alignment devices are used, which are also known in the field of the semiconductor industry as wafer alignment systems.

From the state of the art, an alignment system is known for this purpose from U.S. Pat. No. 6,275,742 B1 for example, and can undertake exact alignment of a disc-shaped workpiece, in particular a wafer, by an optical method.

A device is known from JP 01-267403 A for determining the deflection of a disc-shaped workpiece, it being possible to determine the deformation at circumferential points of the workpiece using said device by means of an optical detector device.

Further devices and methods for determining a deformation of a disc-shaped workpiece, in particular of wafers, are disclosed in JP 10-078310 A, JP 06-163661 A, US 2006/0280085 A1, U.S. Pat. No. 4,750,141 A and U.S. Pat. No. 7,301,623 B1.

It is common to all these known methods that the deformation cannot be determined exactly, since the measurement methods or gripping devices distort the measurement result.

More recently in the semiconductor industry there has been a trend towards what are known as compound wafers or mould wafers, i.e. towards assembled, artificially produced wafers, which are generated by assembling individual chips into a wafer-shaped formation, the chips being glued into a disc-shaped structure again by means of a plastics material sealing compound. Mould wafers of this type, but also conventional thin wafers of silicon or the like, have a circular construction conditional on the previous thermal and mechanical working, and also exhibit deflection in the axial direction, in such a way that these disc-shaped workpieces are not planar, but deflected or deformed.

FIG. 4 is a schematic plan view of a mould wafer, having reference numeral 3, the plastics material moulding mass being denoted as 31 and the semiconductor chips embedded therein being denoted as 30. After the removal of a protective film, the semiconductor chips 30 are exposed at an upper side of the mould wafer 3.

Since the small dimensions of the individual semiconductor chips 30 necessitate exact positioning of the mould wafer 3 for subsequent processing steps, exact alignment must be provided, and knowledge of the deflection properties of the mould wafer 3 is required for this.

This leads to the problem of exactly determining the deflection or deformation of a disc-shaped workpiece of this type. This problem is all the more pressing given that the mould wafers 3, which represent an assembly of a number of individual chips into a wafer-shaped construction using a sealing compound, have a high inherent curvature as a result of the different thermal expansion coefficients of silicon and plastics material, in such a way that no mould wafer 3 is the same as any other. Thus, exact alignment is only possible taking into account the individual deflection of the mould wafers 3, so as to make linear processing possible on a large scale in the manner of an assembly line.

A limit may also be placed on the deflection, so as to discard mould wafers 3 which cannot be processed further.

SUMMARY OF THE INVENTION

The object of the present invention is therefore to specify a method and a device for determining a deformation of a disc-shaped workpiece, particularly a mould wafer, which make it possible to determine the deformation with great precision, without perceptible distortion of the measurement result being caused by the measurement technique itself.

The method according to the invention having the features of claim 1 and the corresponding device according to claim 11 have the advantage over known approaches that they make exact determination of the deformation (warpage) possible.

The idea behind the present invention is that after eliminating an initial eccentricity between the workpiece and the mounting unit, warpage can be measured at a defined height position.

According to the invention, after more precise alignment of the workpiece, the deviation of any number of circumferential measuring points of the workpiece from the predetermined height positions can be determined by rotating the mounting unit about its own axis or by rotating the detector unit about the axis of the mounting unit.

Thus, according to the invention, a two-dimensional representation of the deformation along the measurement circumference of a particular measurement radius can be generated using the deviations of the respective measuring points. Based on this information, in further processing of the disc-shaped workpiece, the deflection can be taken into account or corrected by means of mechanical and/or thermal post-processing, and/or the disc-shaped workpiece may be discarded if a predetermined limit is exceeded.

According to the invention, the mounting unit is not only rotatable, but also adjustable in height and laterally adjustable. Thus, the predetermined height position can be adjusted exactly to measure the deviations of the measuring points, and for example thermal changes or vibrations of the device according to the invention can be compensated.

In the dependent claims there are advantageous developments and improvements of the relevant subject-matter of the invention.

In a preferred development, the eccentricity is determined using a prealigner, which is known per se, to make subsequent position correction possible.

In a further development, the detector unit is movable radially, in such a way that the deformation is possible not only with various angular positions, but also with various diameters. This makes it possible to obtain a three-dimensional dimension of the deflection of the disc-shaped workpiece.

In a preferred development, the high-strength detector means comprises a laser micrometer. In principle, any types of detector units may be used for measuring the deviations, i.e. for the distance measurement, in particular mechanical, optoelectronic and sound-based methods inter alia. Particularly advantageously, an optical micrometer unit which carries out contactless measurement may be used, a laser micrometer unit being particularly adapted because it makes very precise distance measurement possible without mechanical interference with the workpiece.

In a further preferred development, the mounting unit can be moved into the second mounting position by a rotation prior to deposition and a lateral adjustment after deposition.

In a further preferred development, the inner region has a diameter of 10% to 30% of the outer region.

In a further preferred development, calibration of the measurement is carried out without deformation using a standard tool, for example a steel wafer.

In a further preferred development, the respective deviations of the plurality of measuring points are recorded in a table together with the associated angles of rotation and a tool identifier.

In a further preferred development, the angles of rotation are selected relative to a tool marking. A tool marking of this type may for example be an indentation or flattening or an optically detectable marking.

In a further preferred development, the mounting of an inner region of the disc-shaped workpiece is effected using a plurality of support pins and a plurality of vacuum intake elements.

In a further preferred development, one support pin of the plurality of support pins respectively is surrounded by an associated one of the plurality of vacuum intake elements respectively.

Embodiments of the invention are shown in the drawings and described in detail in the following description.

DETAILED DESCRIPTION OF THE INVENTION

Figure 1B:
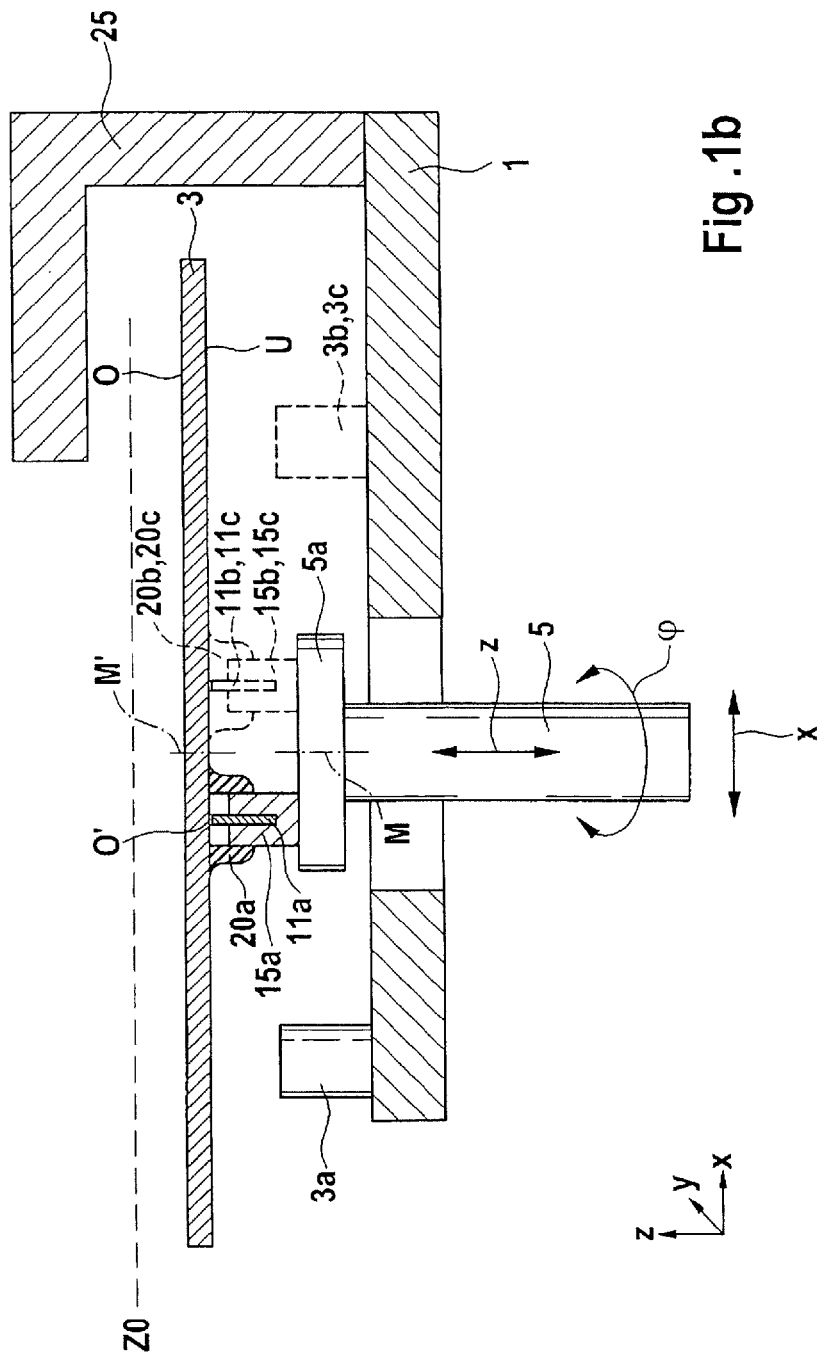
FIG. 1a-c are schematic cross-sectional views of a first embodiment of the device according to the invention for determining a deformation of a disc-shaped workpiece, particularly a mould wafer, along the line A-A' in FIG. 1f.

In the figures, like reference numerals denote like or functionally like components.

Figure 1D:
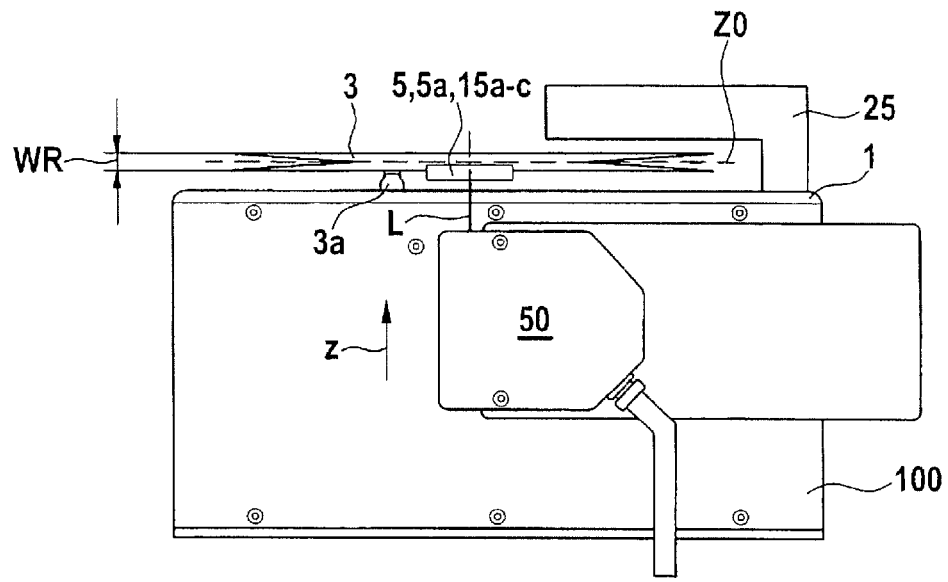
FIGS. 1d,e are schematic side views of the first embodiment of the device according to the invention for determining a deformation of a disc-shaped workpiece, particularly a mould wafer.
Figure 1E:
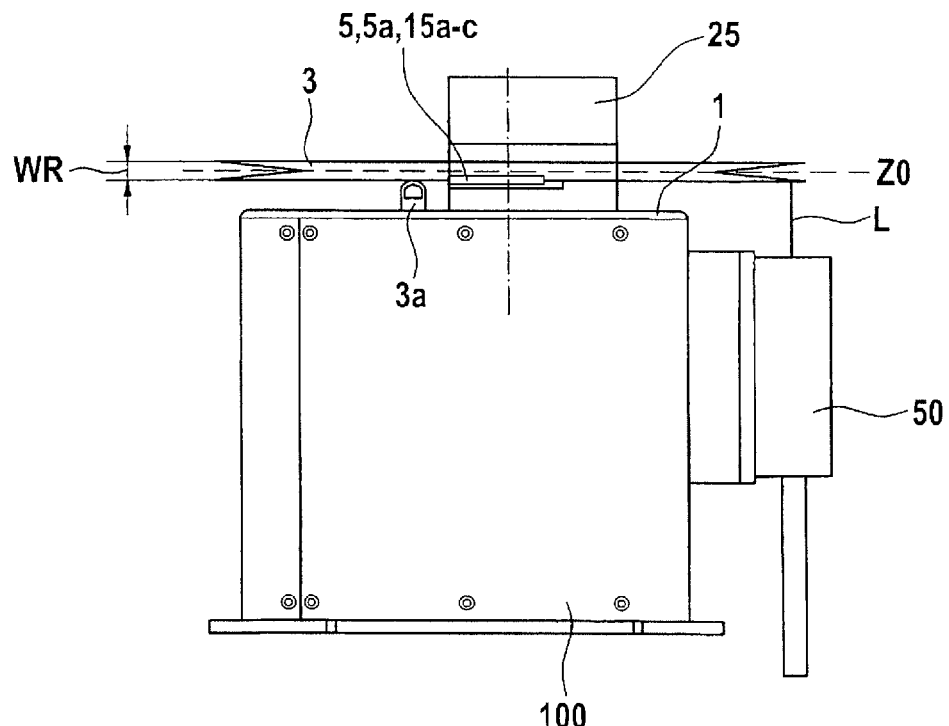
FIG. 1f is a schematic plan view of the first embodiment of the device according to the invention for determining a deformation of a disc-shaped workpiece, particularly a mould wafer.
FIG. 1g is a measurement diagram of a mould wafer, the deformation of which has been determined by means of the device according to the invention for determining a deformation of a disc-shaped workpiece according to FIG. 1a-f.
Figure 1F:
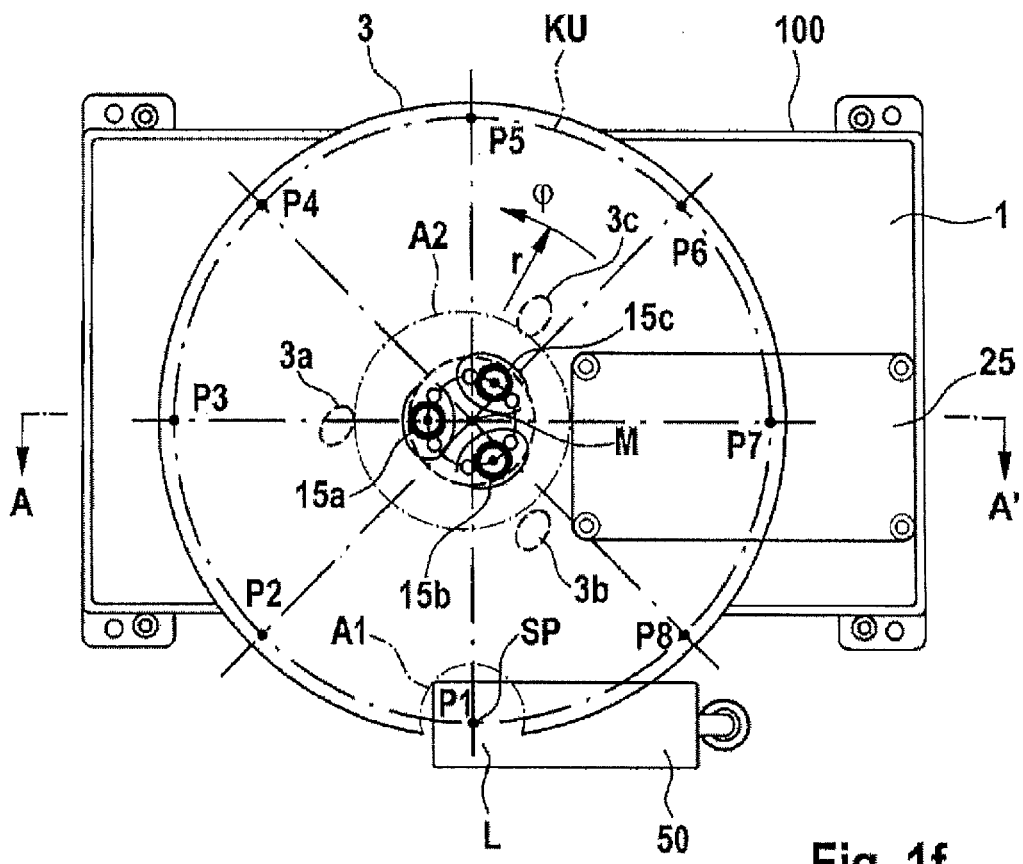

FIG. 1a-c are schematic cross-sectional views of a first embodiment of the device according to the invention for determining a deformation of a disc-shaped workpiece, particularly a mould wafer, along the line A-A' in FIG. 1f.

Figure 4:
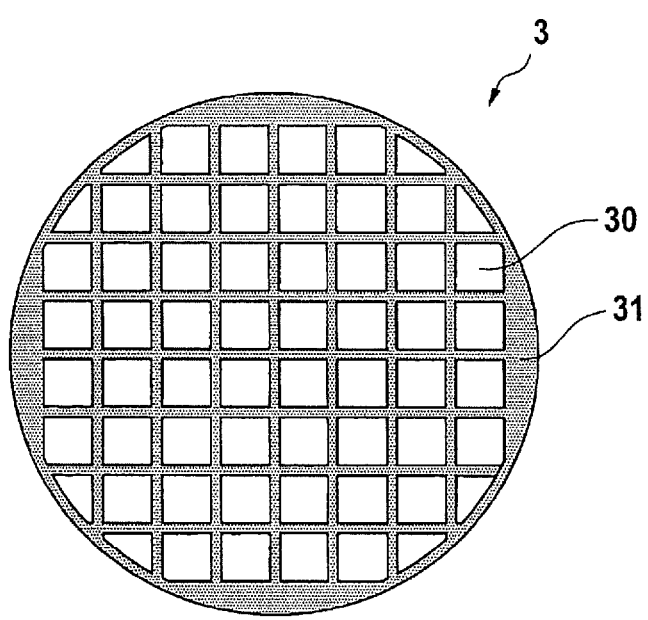
FIG. 4 is a schematic plan view of a mould wafer.

In FIG. 1a-c, reference numeral 3 denotes a mould wafer made of plastics material having silicon chips (not shown) embedded therein (cf. FIG. 4). The mould wafer 3 comprises an inner region IB and an outer region AB in a radial direction. The mould wafer 3 has an upper face O and a lower face U.

The inner region IB of the mould wafer 3 is mounted onto a mounting unit 5, 5a, 15a-c in a first mounting position, in which the centre axis M' of the mould wafer 3 does not match the centre axis M of the axis-centred mounting unit 5, 5a, 15a-c, but rather is offset therefrom by an eccentricity $\delta$.

The mounting unit 5, 5a, 15a-c comprises a stand region 5 which is rotatable about the axis M in any angle of rotation $\phi$ and which is also adjustable in height in the z-direction. The stand region 5 is also laterally adjustable in the x-direction and optionally also in the y-direction. A rotationally symmetrical carrier plate 5a, the axis of which coincides with the centre axis M of the mounting unit 5, 5a, 15a-c, is arranged on the stand region.

Three contact elements 15a, 15b, 15c, which are arranged equidistant from the centre axis M in the form of a triangle and allow application and intake of the mould wafer 3 in the inner region IB thereof, are located on the upper face of the carrier plate 5a. The inner region has a diameter of approximately 10-30% of the entire mould wafer 3. In the case given by way of example, in which the mould wafer 3 has a diameter of 200 mm, the diameter of the inner region IB is between 20 and 60 mm.

The contact elements 15a, 15b, 15c respectively comprise a central support pin 11a, 11b, 11c which is set to a fixed z-position of the mounting unit 5, 5a, 15a-c after a predetermined calibration has been carried out, which is described in detail below. In a further embodiment (not shown), the support pins 11a, 11b, 11c are automatically adjustable, for example by a piezoelectric actuator unit.

The support pins 11a, 11b, 11c are surrounded on all sides by an associated vacuum intake element 20a, 20b, 20c respectively. The vacuum intake elements 20a, 20b, 20c comprise a respective lip seal which ends slightly above the height O' of the support pins 11a, 11b, 11c when the mould wafer 3 is not applied, and which is pressed to the same height as the support pins 11a, 11b, 11c when the mould wafer 3 is applied, owing to the weight thereof. The vacuum elements 20a, 20b, 20c also comprise an intake unit (not shown) for generating a vacuum and a corresponding low pressure in order to mount the mould wafer 3 rigidly onto the support pins 11a, 11b, 11c.

The contact elements 15b, 15c are shown by dashed lines in FIG. 1a-1c, since they are located in different cross-section angles, as can be seen from FIG. 1f.

The device according to FIG. 1a-1c further comprises a carrier unit 1 on which a deposit unit 3a, 3b, 3c is located, which deposit unit is arranged in the periphery of a recess 2 of the carrier unit 1, through which the receiving unit 5, 5a, 15a-c is guided. The deposit unit 3a, 3b, 3c comprises three holding props which are also arranged in triangular symmetry, as can be seen from FIG. 1f. The mould wafer 3 can be deposited on the holding props of the deposit unit 3a, 3b, 3c when the mounting unit 5, 5a, 15 a-c is moved to a correspondingly low z-position.

The holding props 3b, 3c are also shown by dashed lines, since they are located in different section angles of the device, as can be seen from FIG. 1f.

Although they are not shown in FIG. 1a-1c, the carrier unit 1 is connected via a common base 100 to the mounting unit 5, 5a, 15a-c (cf. FIG. 1d-1f).

As already mentioned above, there is an eccentricity δ between the centre axis M of the mounting unit 5, 5a, 15a-c and the centre axis M' of the mould wafer 3 in the mounting position shown in FIG. 1a.

For determining this eccentricity δ, what is known as a prealigner 25 is provided which is configured in such a way that it can determine this eccentricity δ optically according to a known method when the mounting unit 5, 5a, 15a-c is rotated about the z-axis.

Finally, reference symbol Z0 in FIG. 1a-1c denotes a predetermined height position for the receiving unit 5, 5a, 15a-c which is used as a measurement position, as described below.

In addition, with reference to FIG. 1b, a second mounting position of the mould wafer 3 is shown, in which position the centre axes M, M' coincide, in other words the eccentricity δ is substantially zero. This second mounting position is reached by interim deposition of the mould wafer 3 on the holding props of the deposit unit 3a, 3b, 3c and corresponding re-positioning of the receiving unit 5, 5a, 15a-c, as described below.

Finally, with reference to FIG. 1c, the mounting unit 5, 5a, 15a-c is also moved into the predetermined height position Z0, in which the deformation can be measured using a laser beam L by means of a fixed-height detector unit 50 in the form of a laser micrometer. The predetermined height position Z0 is reached when the upper face O' of the support pin 11a, 11b, 11c is located at this height position Z0.

In the state shown in FIG. 1c, an ideal mould wafer 3 is shown which has no deformation or warpage. An ideal wafer of this type, for example a steel wafer, can also be used to calibrate the device in the position shown in FIG. 1c.

FIGS. 1d, e are schematic side views of the first embodiment of the device according to the invention for determining a deformation of a disc-shaped workpiece, particularly a mould wafer.

FIGS. 1d, 1e show a deformation region for deviations WR, which comprises a typical physical mould wafer 3.

In a measuring process of a physical mould wafer 3 of this type, a respective deviation WR of measuring points in the non-mounted outer region AB of the mould wafer 3 is measured by the fixed-height detector device 50 in the form of a laser micrometer, which is fixed to the base 100, from the predetermined height position Z0 by rotating the mounting unit 5, 5a, 15a-c. In an embodiment (not shown), the detector unit 50 may also be rotatable at the set height thereof.

FIG. 1f is a schematic plan view of the first embodiment of the device according to the invention for determining a deformation of a disc-shaped workpiece, particularly a mould wafer.

With further reference to FIG. 1f, the mould wafer 3 is shown having two virtual cutouts A1, A2, through which the mounting unit 5, 5a, 15a-c and a focus point SP of the laser beam L on the lower face U of the mould wafer 3 are visible.

Figure 1G:
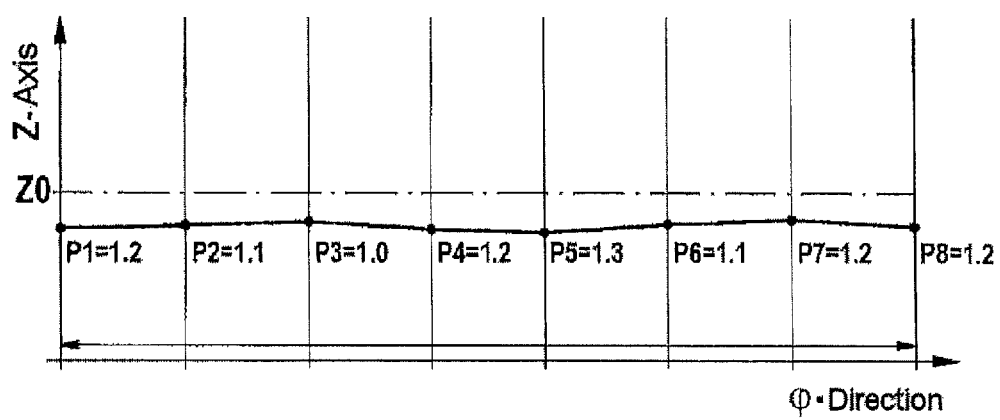

By rotating the mounting unit 5, 5a, 15a-c and carrying out measurements at the measuring points P1, P2, P3, P4, P5, P6, P7, P8 along the circumferential line KU having a predetermined radius r, the height profile shown in FIG. 1g can be adopted. Points P1-P8 are in this case located at the measuring angles φ1-φ8.

FIG. 1g is a measurement diagram of a mould wafer, the deformation of which has been determined by the device according to the invention for determining a deformation of a disc-shaped workpiece according to FIG. 1a-f.

As is shown by FIG. 1g, the mould wafer 3 is deformed in a downward direction at all points P1-P8 shown in comparison to the predetermined height position Z0, and also has a cap-like shape.

With reference to FIG. 1c, it is likewise possible to adjust the detector unit 50 in the radial direction with respect to the mould wafer 3, in order to adopt a height profile of the type shown in FIG. 1g at various circumferences KU having various radii r.

Figure 2:
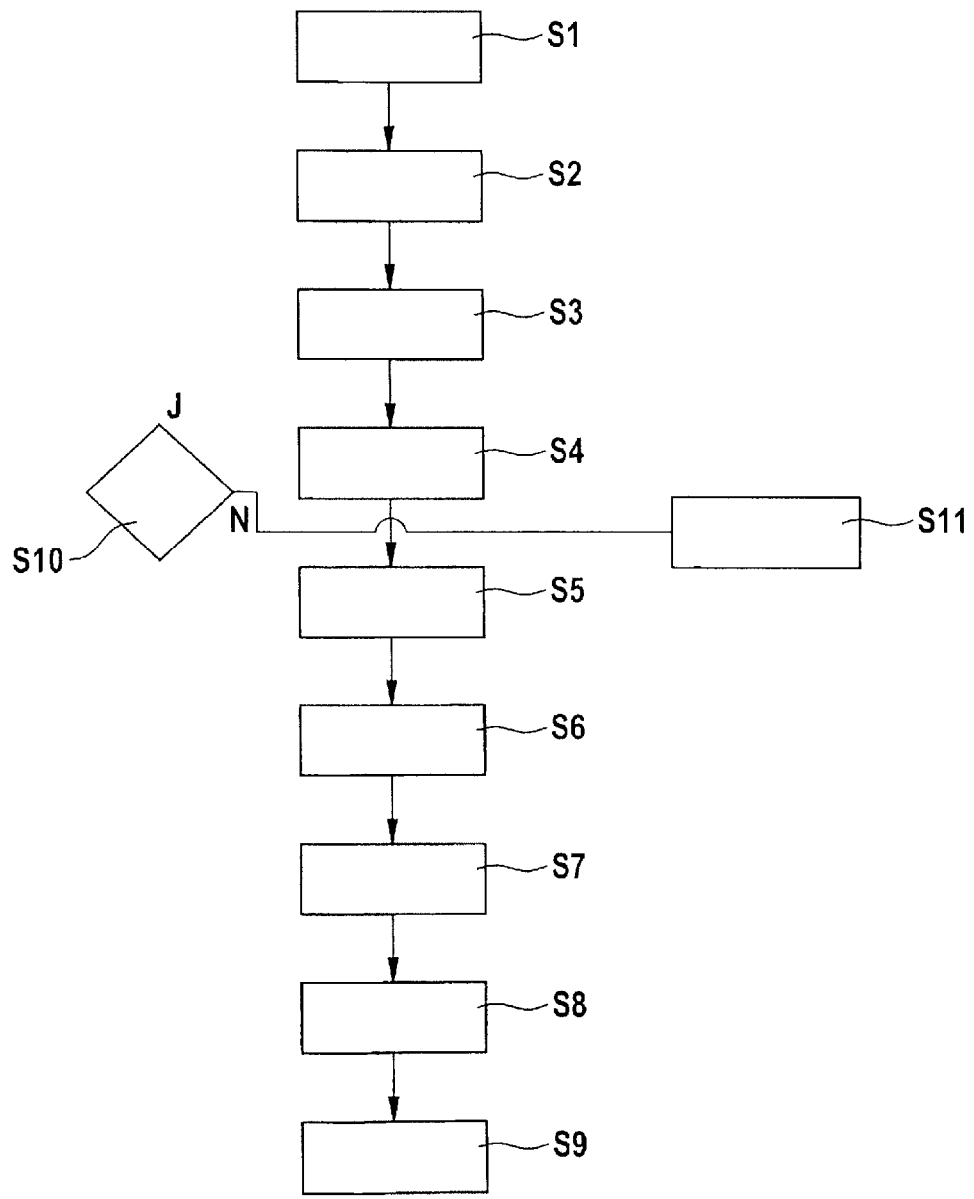
FIG. 2 is a flow diagram of a further embodiment of the method according to the invention for determining a deformation of a disc-shaped workpiece, particularly a mould wafer.

FIG. 2 is a flow diagram of a further embodiment of the method according to the invention for determining a deformation of a disc-shaped workpiece, particularly a mould wafer.

In a method step (not shown), calibration of the device is carried out using an ideal wafer 3 as shown in FIG. 1c. For calibration, the support pins 11a, 11b, 11c can in particular be adjusted in such a way that the ideal mould wafer is positioned having its lower face U exactly at the predetermined height position Z0.

With reference to step S1, the mould wafer 3 is subsequently fitted to the support pins 11a, 11b, 11c of the contact elements 15a, 15b, 15c and is subsequently mounted by actuating the vacuum intake elements 20a, 20b, 20c, as shown in FIG. 1a.

Following this, in step S2 eccentricity δ is measured by optical scanning using the prealigner 25 while the mounting unit 5, 5a, 15a-c rotates about the z-axis.

Following this, in step S3 the mounting unit 5, 5a, 15a-c is rotated into an angular position φ, in which the eccentricity δ occurs in the x-direction.

Subsequently, in step S4, the mould wafer 3 is deposited onto the holding props of the deposit unit 3a, 3b, 3c and the mounting unit 5, 5a, 15a-c is released and moved in the x-direction until the eccentricity δ is substantially equalised, i.e. is zero. This is the state of the method according to step S5.

Following this, in step S6 the mould wafer 3 is mounted once more in a second mounting position and returned in the x-direction, and is subsequently lifted into the predetermined height position Z0, which is equal to the measurement position.

In the predetermined height position Z0, in step S7, as already described in connection with FIGS. 1f, 1g, a respective deviation MR of measuring points P1-P8 in the non-mounted outer region AB of the mould wafer 3 from the predetermined height position Z0 is measured using the detector unit 50, the mounting unit 5, 5a, 15a-c being rotated by corresponding angles of rotation φ1-φ8.

In step S8, the respective deviations WR from the measuring points P1-P8 are recorded in a table together with the associated angles of rotation φ1-φ8 and a tool identifier (not shown), for example a wafer number. In this case it is thus expedient that the angles of rotation φ1-φ8 have previously been selected relative to a tool marking, such as an indentation, or a planar portion, or an optical marking.

In step S9 the mounting unit 5, 5a, 15a-c is then released and the mould wafer 3 is removed and subsequently in step S10, it is checked whether a further mould wafer 3 must be measured. If this is the case, the method returns to step S1, otherwise the method is ended in step S11.

Figure 3:
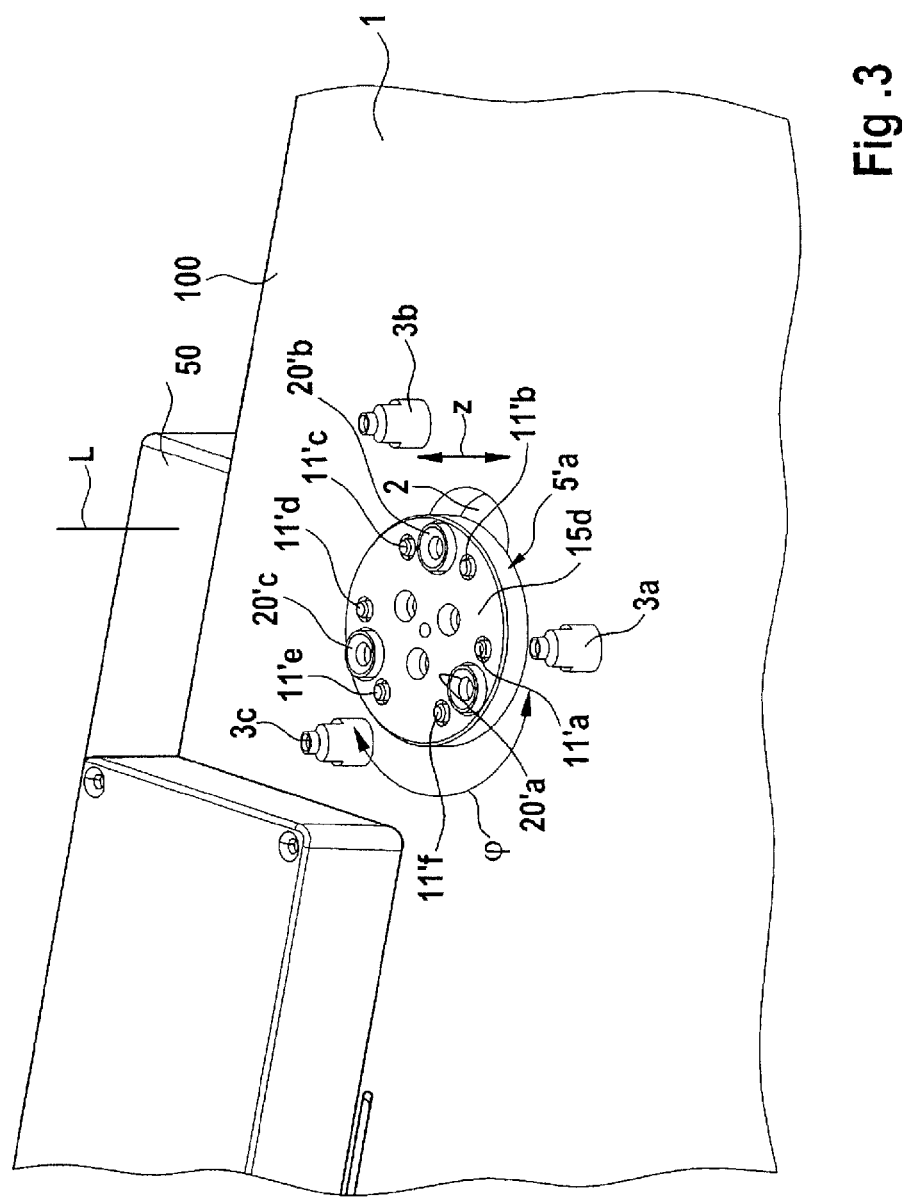
FIG. 3 is a schematic perspective view of a second embodiment of the device according to the invention for determining a deformation of a disc-shaped workpiece, particularly a mould wafer.

FIG. 3 is a schematic perspective view of a second embodiment of the device according to the invention for determining a deformation of a disc-shaped workpiece, particularly a mould wafer.

In the second embodiment shown in FIG. 3, instead of the contact elements 15a-c of the first embodiment, a contact element unit 15d is provided, which comprises a plurality of support pins 11'a-11'f and three vacuum intake elements 20'a, 20'b and 20'c. In this embodiment, the support pins 11'a-11'f are not guided through the vacuum intake elements, but are provided separately therefrom, two support pins respectively flanking a vacuum intake element on both sides.

Otherwise, the construction of the second embodiment is identical to that of the above-described first embodiment.

Although the present invention has been described on the basis of preferred embodiments, it is not limited thereto, but can be modified in various ways.

It should be noted in particular that the above embodiments can of course be combined with one another.

Although the above examples relate to determining the deformation of mould wafers, the invention is not limited thereto, but is applicable to any disc-shaped workpiece.

Although the above embodiments relate to mounting units having a plurality of deposit points, the invention is not limited thereto, but is also suitable for other, for example planar, mounting units which either influence the deformation of the workpiece, only very slightly or not at all. Additionally, the shape of the deposit point arrangement is also only exemplary, and is not limited to the described triangular arrangement.

The invention claimed is:

1. Method for determining a deformation of a mould wafer comprising the steps of:
   mounting an inner region of the mould wafer onto a mounting unit in a first mounting position;
   determining an eccentricity of a centre axis of the mould wafer from a centre axis of the mounting unit in the first mounting position;
   depositing the mould wafer onto a deposit unit;
   re-mounting the inner region of the mould wafer onto the mounting unit in a second mounting position based on the determined eccentricity, the eccentricity in the second mounting position being substantially zero;
   moving the mounting unit into a predetermined height position;
   measuring a deviation of a plurality of measuring points respectively in a non-mounted outer region of the mould wafer from the predetermined height position corresponding to the deformation by means of a fixed-height detector unit by rotating the mounting unit or the detector unit about suitable angles of rotation;
   wherein the mounting of the inner region of the mould wafer is effected using a plurality of support pins and a plurality of vacuum intake elements;
   wherein one support pin of the plurality of support pins respectively is surrounded by an associated one of the plurality of vacuum intake elements respectively;
   wherein the vacuum intake elements comprise a respective lip seal, which surrounds the respectively associated support pin; and
   wherein the mould wafer is carried by the support pins and the lip seals in the mounted state.

2. Method according to claim 1, wherein the plurality of measuring points are arranged along a circumferential line.

3. Method according to claim 1, wherein the fixed-height detector unit comprises a laser micrometer.

4. Method according to claim 1, wherein the mounting unit is moved into the second mounting position by a rotation prior to deposition and a lateral adjustment after deposition.

5. Method according to claim 1, wherein the inner region has a diameter of 10% to 30% of the mould wafer.

6. Method according to claim 1, wherein calibration of the measurement is carried out without deformation using a standard tool.

7. Method according to claim 1, wherein the respective deviations of the plurality of measuring points are recorded in a table together with the associated angles of rotation and a tool identifier.

8. Method according to claim 1, wherein the angles of rotation are selected relative to a tool marking.

9. Device for determining a deformation of a mould wafer, comprising:
   a rotatable, height and laterally adjustable mounting unit for mounting an inner region of the mould wafer;
   a determination unit for determining eccentricity of a centre axis of the mould wafer from a centre axis of the mounting unit and for generating a suitable adjustment signal for the mounting unit;
   a deposit unit for depositing the mould wafer during a process of lateral adjustment of the mounting unit; and
   a fixed-height detector unit for measuring the deviation of a plurality of measuring points, respectively, in a non-mounted outer region of the mould wafer from a predetermined height position corresponding to the deformation by rotating the mounting unit or the detector unit at a predetermined height position of the mounting unit;
   wherein the mounting unit comprises a plurality of support pins and a plurality of vacuum intake elements;
   wherein one support pin of the plurality of support pins respectively is surrounded by an associated one of the plurality of vacuum intake elements respectively, and
   wherein the vacuum intake elements comprise a respective lip seal, which surrounds the respectively associated support pin; and
   wherein the support pins and the lip seals are configured to carry the mould wafer in the mounted state.

10. Device according to claim 9, wherein the support pins are adjustable in height.

11. Device according to claim 9, wherein the mounting unit is guided through a recess in a carrier unit and the deposit unit is provided in the periphery of the recess.

12. Device according to claim 11, wherein the deposit unit comprises a plurality of holding props.

13. Device according to claim 11, wherein the fixed-height detector unit is arranged on the carrier unit.

14. Device according to claim 9, wherein the fixed-height detector unit comprises a laser micrometer.

15. Device according to claim 9, wherein the determination unit is arranged on the carrier unit.

16. Device according to claim 9, wherein the determination unit comprises a prealigner.

17. Device according to claim 9, wherein the fixed-height detector unit is adjustable radially with respect to the workpiece.

* * * * *

UNITED STATES PATENT AND TRADEMARK OFFICE
CERTIFICATE OF CORRECTION

| | | |
|---|---|---|
| PATENT NO. | : 8,599,366 B2 | Page 1 of 1 |
| APPLICATION NO. | : 13/399403 | |
| DATED | : December 3, 2013 | |
| INVENTOR(S) | : Rüdiger Schindler | |

It is certified that error appears in the above-identified patent and that said Letters Patent is hereby corrected as shown below:

On title page, item 75 - Inventor
      replace "Rudger Schindler"
      with --Rüdiger Schindler--.

Signed and Sealed this
Ninth Day of September, 2014

Michelle K. Lee
*Deputy Director of the United States Patent and Trademark Office*